(12) United States Patent
Jenkinson

(10) Patent No.: US 10,120,474 B2
(45) Date of Patent: Nov. 6, 2018

(54) TOUCH SCREEN TESTING PLATFORM FOR ENGAGING A DYNAMICALLY POSITIONED TARGET FEATURE

(71) Applicant: T-Mobile USA, Inc., Bellevue, WA (US)

(72) Inventor: David Ross Jenkinson, Auburn, WA (US)

(73) Assignee: T-Mobile USA, Inc., Bellevue, WA (US)

( * ) Notice: Subject to any disclaimer, the term of this patent is extended or adjusted under 35 U.S.C. 154(b) by 86 days.

(21) Appl. No.: 15/208,536

(22) Filed: Jul. 12, 2016

(65) Prior Publication Data

US 2016/0320889 A1 Nov. 3, 2016

Related U.S. Application Data

(63) Continuation-in-part of application No. 14/314,339, filed on Jun. 25, 2014, now Pat. No. 9,652,077, which
(Continued)

(51) Int. Cl.
*G06F 3/00* (2006.01)
*G06F 3/041* (2006.01)
(Continued)

(52) U.S. Cl.
CPC .......... *G06F 3/0412* (2013.01); *B25J 9/02* (2013.01); *B25J 11/00* (2013.01); *G06F 3/0418* (2013.01);
(Continued)

(58) Field of Classification Search
CPC ........ G06F 3/0412; G06F 3/0418; B25J 9/02; B25J 11/00; Y10T 74/20305; G01R 1/06705; Y10S 901/47
See application file for complete search history.

(56) References Cited

U.S. PATENT DOCUMENTS 4,786,867 A 11/1988 Yamatsu
5,798,627 A 8/1998 Gilliland et al.
(Continued)

FOREIGN PATENT DOCUMENTS

EP 1713239 A1 10/2006
JP 2003124871 A 4/2003
(Continued)

OTHER PUBLICATIONS

DigiMetrix Robotics, "Touch and Sense Test with Mitsubishi 6-axis Robot Arm Powered by NI LabVIEW", Apr. 17, 2014, https://youtu.be/s12GCt2rl7o (Year: 2014).*
(Continued)

*Primary Examiner* — Nicholas Kiswanto
(74) *Attorney, Agent, or Firm* — Lee & Hayes, PLLC

(57) ABSTRACT

A touch screen testing platform may be used to engage a dynamically positioned target feature being displayed on a touch screen enabled device during a testing protocol. The platform may record imagery displayed by the touch screen device and then analyze the imagery to locate the target feature within a reference coordinate system. The platform may recognize that the target feature is missing from the imagery and respond by causing the touch screen device to scroll through a command menu and/or toggle through virtual screens. Once located, the platform may instruct a robotic device tester to select the target feature by contacting the touch screen at the identified location using a conductive tip designed to simulate a user's fingertip. Prior to running a test, the camera may be focused to a point that is offset from the display screen of the touch screen device.

19 Claims, 6 Drawing Sheets

Related U.S. Application Data is a continuation-in-part of application No. 12/964,427, filed on Dec. 9, 2010, now Pat. No. 8,996,166.

(51) Int. Cl.
*B25J 9/02* (2006.01)
*B25J 11/00* (2006.01)
*G01R 1/067* (2006.01)

(52) U.S. Cl.
CPC ......... *G01R 1/06705* (2013.01); *Y10S 901/47* (2013.01); *Y10T 74/20305* (2015.01)

(56) References Cited

U.S. PATENT DOCUMENTS

| | | |
|---|---|---|
| 6,008,636 A | 12/1999 | Miller et al. |
| 6,118,288 A | 9/2000 | Kang |
| 6,249,718 B1 | 6/2001 | Gilliland et al. |
| 6,282,460 B2 | 8/2001 | Gilliland et al. |
| 6,341,259 B1 | 1/2002 | Gutierrez et al. |
| 6,708,132 B1 | 3/2004 | Gutierrez et al. |
| 6,825,680 B1 | 11/2004 | Kogan et al. |
| 7,167,197 B2 | 1/2007 | Hill et al. |
| 7,831,337 B2 | 11/2010 | Greenspan |
| 7,916,127 B2 * | 3/2011 | Wang ............ G06F 3/0416 178/18.01 |
| 8,576,182 B2 | 11/2013 | Hristov |
| 8,698,778 B2 * | 4/2014 | Habermehl ........ G06F 3/04845 345/174 |
| 8,988,087 B2 | 3/2015 | Uzelac et al. |
| 8,996,166 B2 | 3/2015 | Jenkinson |
| 9,024,899 B2 * | 5/2015 | Rovito ............ G06F 3/0418 345/158 |
| 9,041,659 B2 * | 5/2015 | Perski ............ G06F 3/041 178/18.03 |
| 2003/0179296 A1 | 9/2003 | Hill et al. |
| 2004/0183787 A1 | 9/2004 | Geaghan et al. |
| 2005/0135972 A1 | 6/2005 | Lemme et al. |
| 2005/0231595 A1 | 10/2005 | Wang et al. |
| 2005/0244049 A1 | 11/2005 | Onishi et al. |
| 2006/0048025 A1 | 3/2006 | Filipovic |
| 2006/0063599 A1 | 3/2006 | Greenspan |
| 2007/0025443 A1 | 2/2007 | Inokuma |
| 2009/0265035 A1 | 10/2009 | Jenkinson et al. |
| 2010/0095234 A1 | 4/2010 | Lane et al. |
| 2010/0129181 A1 | 5/2010 | Blasiak et al. |
| 2011/0251719 A1 | 10/2011 | Lien et al. |
| 2012/0146956 A1 | 6/2012 | Jenkinson |
| 2012/0280934 A1 | 11/2012 | Ha et al. |
| 2013/0169549 A1 | 7/2013 | Seymour et al. |
| 2014/0111484 A1 | 4/2014 | Welch et al. |
| 2014/0309775 A1 | 10/2014 | Jenkinson |
| 2016/0167238 A1 | 6/2016 | Matthews et al. |
| 2016/0187876 A1 | 6/2016 | Diperna et al. |

FOREIGN PATENT DOCUMENTS

| | | |
|---|---|---|
| KR | 101146824 | 5/2012 |
| WO | WO2013122586 | 8/2013 |
| WO | WO2013158646 | 10/2013 |

OTHER PUBLICATIONS

DigiMetrix Robotics, "Touch and Sense Test with Mitsubishi 6-axis Robot Arm Powered by NI LabVIEW", Apr. 27, 2014, https://youtu.be/s12GCt2rl7o (Year: 2014).*
Office Action for related U.S. Appl. No. 12/239,271, dated Jun. 19, 2012, 12 pages.
Office action for U.S. Appl. No. 14/314,339, dated Feb. 23, 2016, Jenkinson, "Touch Screen Testing Platform Having Components for Providing Conductivity to a Tip", 10 pages.
Office Action for U.S. Appl. No. 14/314,339, dated Sep. 9, 2015, David Ross Jenkinson, "Touch Screen Testing Platform Having Components for Providing Conductivity to a Tip", 9 pages.
The PCT Search Report and Written Opinion dated Sep. 16, 2015 for PCT application No. PCT/US2015/035844, 12 pages.
International Search Report for PCT/US2009/041094, dated Jun. 24, 2009, 3 pgs.
PCT Search Report and Written Opinion dated Sep. 18, 2017 for PCT Application No. PCT/US17/40983, 9 pages.
Office action for U.S. Appl. No. 14/314,339, dated Jul. 20, 2016, Jenkinson, "Touch Screen Testing Platform Having Components for Providing Conductivity to a Tip", 9 pages.
The Extended European Search Report dated Jan. 19, 2018 for European Patent Application No. 15812804.1, 8 pages.

* cited by examiner

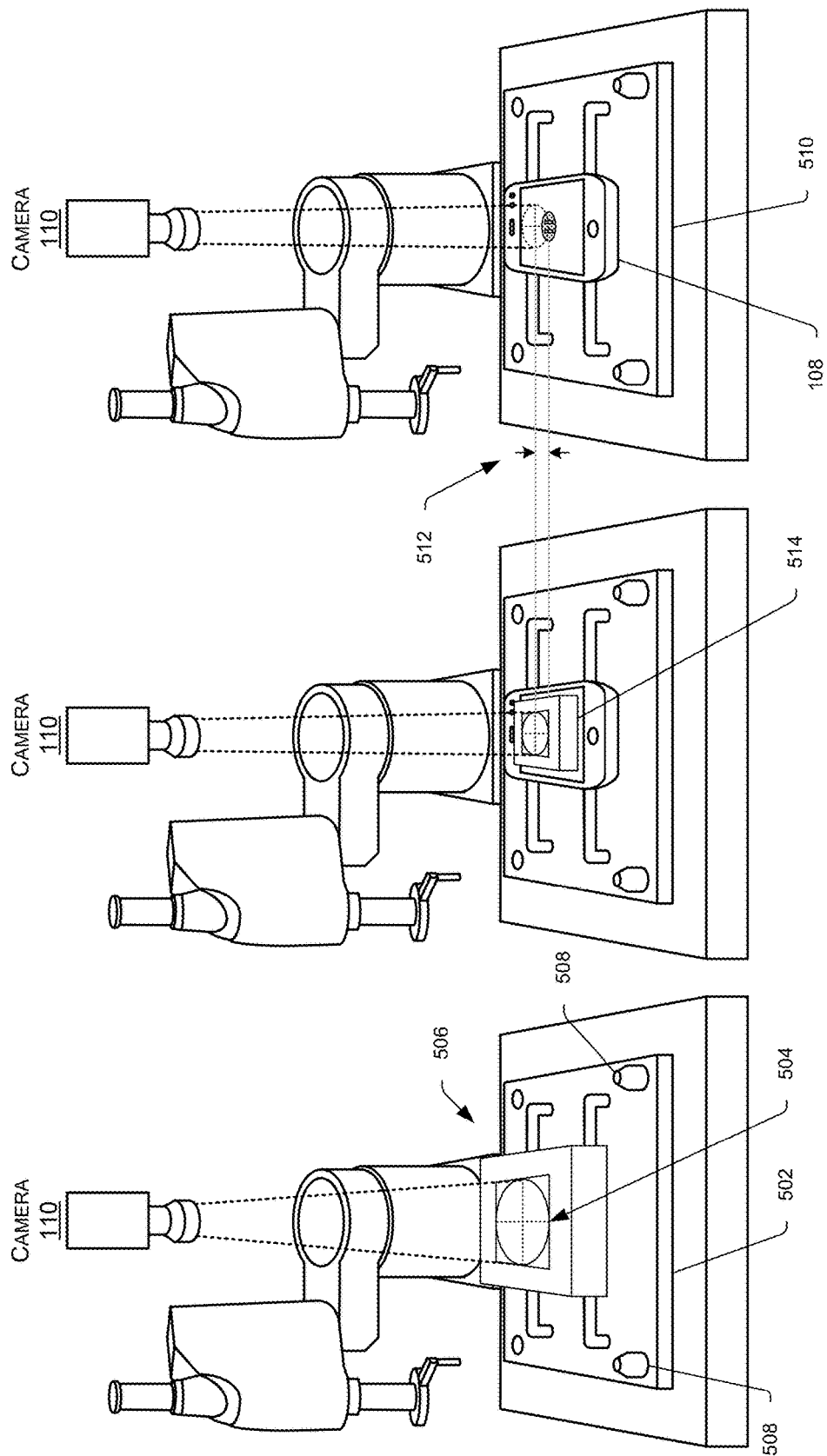

600

PLACING A TOUCH SCREEN DEVICE AT A TESTING LOCATION WITHIN FIELD OF VIEW OF CAMERA
602

CAUSING FOCAL POINT OF CAMERA TO BE OFFSET FROM SCREEN OF THE TOUCH SCREEN DEVICE
604

FOCUSING CAMERA TO FOCAL TARGET ON JIG BEFORE TOUCH SCREEN DEVICE PLACED AT TESTING LOCATION 606

FOCUSING CAMERA TO FOCAL TARGET RESTING ABOVE TOUCH SCREEN DEVICE AT TESTING LOCATION 608

INITIATING COMPUTER-IMPLEMENTED TESTING PROTOCOL
610

FIG. 6

TOUCH SCREEN TESTING PLATFORM FOR ENGAGING A DYNAMICALLY POSITIONED TARGET FEATURE

CROSS REFERENCE TO RELATED APPLICATIONS

This patent application is a Continuation-in-Part of co-pending U.S. patent application Ser. No. 14/314,339 entitled "Touch Screen Testing Platform having Components for Providing Conductivity to a Tip," filed on Jun. 25, 2014, which application is a Continuation-in-Part of U.S. patent application Ser. No. 12/964,427 entitled "Touch Screen Testing Platform," filed on Dec. 9, 2010, which are each hereby incorporated by reference in their entirety as if fully set forth herein.

FIELD OF THE DISCLOSURE

The present disclosure relates generally to robotically testing touch screen devices and, more particularly, it relates to a testing system for dynamically recognizing a location of a target feature on a touch screen and engaging the touch screen at that location to select the target feature.

BACKGROUND

The electronics industry is a dynamic industry where new products are continually being released and implemented for use by people and businesses in the marketplace. Many new products include touch screens that enable a user to input commands to an electronic device by touching the screen of the device rather than relying on traditional inputs such as buttons and directional control pads.

Before a product (e.g., device, system, software, and/or hardware) is implemented in the market or made available for consumption, the product often undergoes testing to ensure that the product is fully functional and operational upon deployment. The testing may be used to measure durability, battery performance, application performance, screen sensitivity, or other quantifiable aspects of the operation of the electronic device subjected to the testing.

Traditional testing platforms are configured to test telecommunication devices that have traditional inputs, such a buttons, which have a fixed location on the device. However, with touch screen enabled devices, an application designer may place input controls anywhere within the display screen, which may require user interaction to determine a location of an input control used to perform a desired action. Furthermore, in some instances the location of the input controls is may change over time. Accordingly, the positions of some input controls cannot be assumed to be statically located each time they are displayed.

BRIEF DESCRIPTION OF THE DRAWINGS

The Detailed Description is set forth with reference to the accompanying figures. In the figures, the left-most digit(s) of a reference number identifies the figure in which the reference number first appears. The use of the same reference numbers in different figures indicates similar or identical items or features.

FIGS. 5A-5C depict the platform in various states of a camera calibration procedure, in accordance with various implementations.

FIG. 6 is a flow diagram of an illustrative process to calibrate a camera to have a focal offset from the touch screen device during or prior to a testing protocol.

DETAILED DESCRIPTION

A touch screen testing platform may be used to perform repeatable testing of a touch screen device, such as a telecommunications device that includes a touch screen display. During a test scenario, a robotic device tester may initiate various operations of the touch screen device by engaging a touch screen of the touch screen device. The operations in the test scenario may include, without limitation, initiating voice calls, transmitting and receiving data (messages, videos, music, etc.), running applications, and performing other operations. By running scenarios such as the example test scenario described above, touch screen devices may be tested in a laboratory environment using an automated process and include relatively quick cycle times, making the tests relatively inexpensive and repeatable. Results of the tests may be analyzed to determine performance of the touch screen device, which may be compared to threshold performance metrics or used for other purposes.

Prior to running a test, the platform may be calibrated to determine a planar surface defined by the touch screen and to establish a coordinate system across the planar surface. The controller may then be programmed to interact with the touch screen at known input locations using the coordinate system. In some instances, however, particular input locations may be unknown until actually displayed by the touch screen device. In such instances, the controller may utilize a camera feed to determine a presence/absence of and, ultimately, one or more input locations, e.g. a location of a target feature corresponding to a device command. For example, the controller may cause the touch screen device to display a command and/or navigational menu in which input locations for various features may vary and then selectively engage a target feature wherever it is displayed. Furthermore, the controller may recognize an absence of the target feature and, in response thereto, cause the robot to alter the imagery displayed by the touch screen device to find the target feature, e.g. by scrolling through the navigational and/or command menu.

In various instances, the camera may be intentionally focused at a plane that is offset from the planar surface defined by the touch screen. The camera may then record imagery displayed by the touch screen, while a focal point of the camera is offset from the touch screen, and provide this imagery to the controller to identify a location of the target feature on the touch screen.

It should be understood that although the disclosure describes several examples and related embodiments, the disclosure is not intended to be all-inclusive nor exhaustive in its descriptions. As such, it should be appreciated that the subject matter of the disclosure can be reasonably modified, rearranged, or otherwise altered, to achieve similar results.

Figure 1:
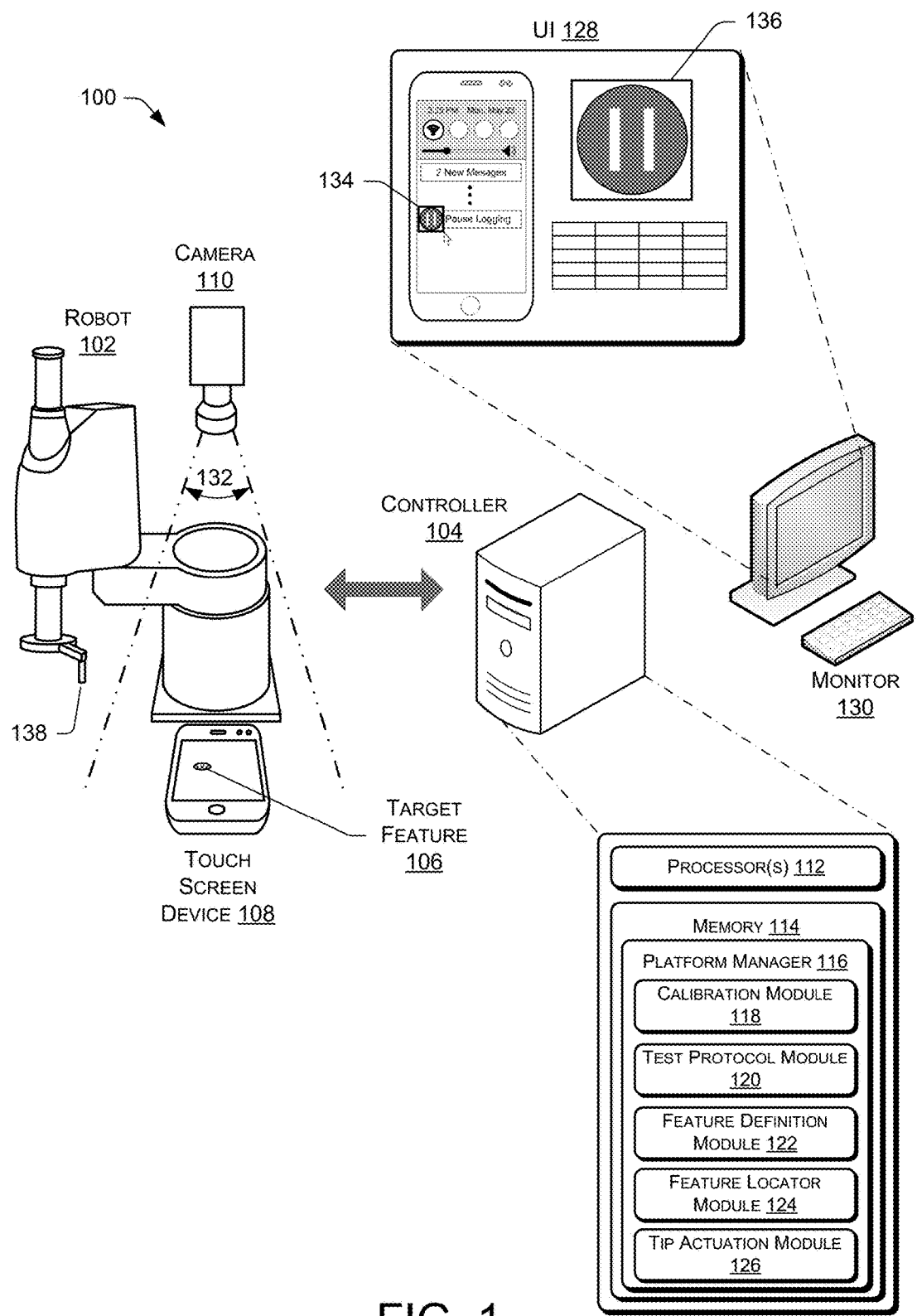
FIG. 1 is an illustrative environment including a robotic device tester and a controller to identify a location of a target feature displayed on a touch screen device and control movement of the robotic device tester to selectively engage the touch screen at the location of the target feature.

FIG. 1 is an illustrative environment 100 including a robotic device tester ("robot") 102 and a controller 104 to identify a location of a target feature 106 displayed on a touch screen enabled electronic device ("touch screen device") 108 and control movement of the robot 102 to selectively engage the touch screen device 108 at the location of the target feature 106. The robot 102 may operate in accordance with instructions that are received from the controller 104. For example, the controller 104 may transmit a command to the robot 102. In response to such commands, the robot 102 may then execute a movement to cause a tip 138 of a moveable arm to engage a touch screen display of the touch screen device 108 and thereby initiate an operation to be performed by the touch screen device 108 (e.g., initiate a telephone call, interact with an application, etc.).

The illustrative environment also includes a camera 110 to record imagery displayed by the touch screen device 108 and transmit the imagery (e.g. as a video feed and/or individual still images) to the controller 104 to locate the target feature 106 on the touch screen device 108 and, after the target feature location becomes known, to transmit a command to the robot 102 to select the target feature 106. Accordingly, when a particular target feature is dynamic such that it may be displayed at/on various locations and/or virtual screens of the touch screen device 108, the controller 104 may locate such target features, e.g. by analyzing imagery from the camera 110, as a pre-curser to instructing the robot 102 to engage these target features. When a particular target feature is displayed at a static location (e.g. a feature that, when displayed, is always displayed at a known location) the controller 104 may instruct the robot 102 to engage the target feature at the known location without searching for or otherwise locating the target feature.

As illustrated, the controller 104 may be equipped with one or more processor(s) 112 and memory 114. The memory 114 may include applications, modules, and/or data. In some embodiments, the memory 114 may include a platform manager 116 to interact with the robot 102 and the camera 110. The platform manager 116 may include a calibration module 118, a test protocol module 120, a feature definition module 122, a feature locator module 124, and a tip actuation module 126, among other possible modules that enable the controller 102 to interact with the robotic device 104, and thereby perform test scenarios on the touch screen device 108. Each module is discussed in turn.

The calibration module 118 may be used to calibrate operation of the robotic device 104. In some embodiments, after the touch screen device 108 is securely mounted to a testing fixture, the controller 104 may identify and store various locations of the touch screen display as part of the calibration operation. For example, the controller 104 may identify and store information defining the perimeter of the touch screen display portion of the touch screen device 108. The calibration module 118 may identify a planar surface of the touch screen display and may create a reference coordinate system within the planar surface to enable a user (e.g., engineer, researcher, etc.) to designate locations of various touch screen inputs. For example, the user may designate locations of virtual buttons representative of a QWERTY keyboard that are displayed by the touch screen device 108.

The test protocol module 120 may generate and transmit instructions that control movement of the robot 102, which performs one or more tests by interacting with the touch screen device 108. The test protocol module 120 may provide instructions to perform stress testing, repetitive testing, performance testing (e.g., speed, battery life, etc.), screen sensitivity testing, or other types of testing. The test protocol module 120 may store high-level instructions which lack at least some information that is used during execution by the robot 102. A high-level instruction may be stored which causes the robot 102 to select a particular target feature, e.g. the "Pause Logging" target feature 106. During execution, such a high-level instruction may execute one or more sub-instructions to obtain any information to be used during execution of the high-level instruction. For example, a high-level instruction designed to engage the "Pause Logging" target feature 106 may include/call upon sub-instructions to determine whether the target feature 106 is currently displayed on the touch screen device 108 and, if it is, to determine its current location of display. If it is determined that the target feature 106 is not currently displayed, the controller 104 may cause the robot 102 to provide an input to the touch screen device 106 which causes the target feature 106 to become displayed, e.g. the robot 102 may provide a "swipe" input across the touch screen to toggle between virtual screens and/or open a command menu.

The feature definition module 122 may store information corresponding to visual characteristics of various features to be designated as target features in various instructions implemented or generated by the test protocol module 120. For example, information corresponding to visual characteristics of the "Pause Logging" target feature 106 may describe a pattern having two upright bars superimposed over a contrasting circular background, e.g. item 136 in FIG. 1. Such visual characteristic information may also include definitions of: colors and/or ranges of colors for the components of the target features; aspect ratios of portions of the target feature to other portions, e.g. the size of the upright bars with respect to the circle; an orientation of the target feature with respect to the touch screen; and/or any other visual characteristics which may be utilized to describe a target feature. In some embodiments, the feature definition module 122 may be accessible via a user interface ("UI") 128 that is displayed on a monitor 130. The UI 128 may enable a user to enter defining characteristics for target features. For example, a user may cause the touch screen device 108 to display the target feature 106 while within a field-of-view 132 of the camera 110 which may transmit a recording of the imagery displayed on the touch screen device 108 to the feature definition module 122 for display on the UI 128. The UI 128 may enable a user to select a feature of interest for potential designation as a target feature during a testing protocol. For example, a user may manipulate a box 134 to define a perimeter of the feature of interest. Contents of the box 134 as superimposed over the image of the touch screen may be enlarged in an extracted image box 136 in which a user may make further manipulations of the image prior to saving it as a target feature for storage in the feature definition module 122. Exemplary manipulations may include, but are not limited to, removing portions of the image which are unrelated to the feature of interest, e.g. a background and/or theme color of the touch screen device 106, or defining characteristics of the target feature, e.g. if a stop symbol is being designated as a target feature then the user may indicate that the feature will always appear as some shade of red. In accordance with various embodiments, the UI 128 may also enable the user to interact with the various other modules of the platform manager 116 including, but not limited to, any of those specific modules described herein.

During the running of a testing protocol, the feature locator module 124 may scan imagery received from the camera 110 to locate the target feature 106 and to provide the determined location data, e.g. coordinates of the target feature in a reference coordinate system, to the test protocol module 120 to supplement the high-level instructions. For example, the testing protocol module 120 may initiate a high-level instruction to pause a logging task being performed by the touch screen device 108 and may call upon the feature locator module 124 to locate the target feature 106 so that it can be engaged. The feature locator module 124 may then access data stored and/or generated by the feature definition module 122 to scan the imagery for the defining visual characteristics of the target feature 106. If the visual characteristics are identified, the feature locator module 124 may generate the location data. The feature locator module 124 may also review contextual information within the imagery to confirm that the target feature 106 has not been misidentified. For example, upon locating a pause symbol substantially matching the visual characteristics of target feature 106, the feature locator module 124 may scan the contextual surroundings of the identified pause symbol to ensure that it is located next to the phrase "Pause Logging" and that it is not next to the phrase "Pause Music" or simply superimposed over a streaming media display indicating that selection thereof will pause a video rather than the logging task. The feature locator module 124 may also convert imagery received from the camera 110 into text using optical character recognition (OCR). In some embodiments, the feature locator module 124 may also identify various objects, such as virtual buttons, links, or commands that are displayed by the touch screen device and may be interacted with using the robotic device 102.

The tip actuation module 126 may select and move a tip 138 to engage the touch screen display of the touch screen device 108. The tips may be synthetic pads (e.g., rubberized, plastic, etc.), that are moveably controlled by the robot 102 to engage the touch screen display in accordance with instructions from the test protocol module 120. In some embodiments, the tip actuation module 126 may select a tip from multiple available tips. In various embodiments, the tip actuation module 126 may be used to controllably perform multi-touch operations on the touch screen device 108 by moving two or more tips that simultaneously engage the touch screen display.

Although FIG. 1 only shows one controller, the components/modules of the controller 104, or portions of the components/modules may be implemented on separate computing devices, such as a separate computing device dedicated to the robot 102 and a separate computing device dedicated to running testing protocols. Thus, the various components described in FIG. 1 may be implemented, in whole or in part, across any combination of different computing devices in accordance with this disclosure.

Figure 2:
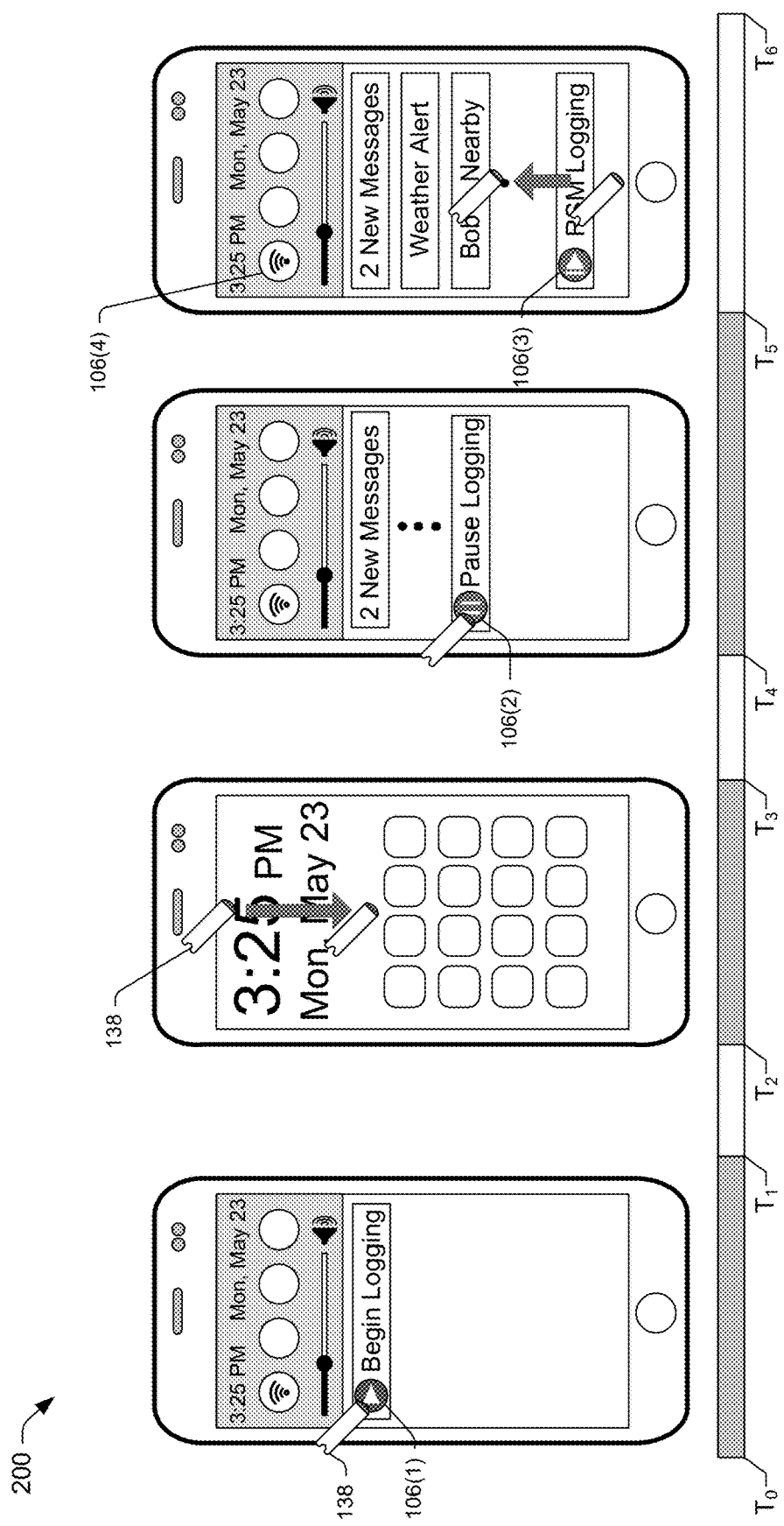
FIG. 2 depicts various imagery displayed by a touch screen device over time in response to various inputs received from the robotic device tester.

FIG. 2 depicts an exemplary implementation 200 in which various imagery is displayed by a touch screen device 108 in response to various inputs received from the robot 102 over time. In particular, FIG. 2 depicts the touch screen device 108 changing displayed imagery responsive to various inputs provided to the touch screen via robotic movement of the tip 138 with reference to a timeline 202. The timeline 202 starts at the left such that time lapses from left to right.

In the exemplary implementation, the touch screen device 108 is depicted as displaying a "Begin Logging" target feature 106(1) which may be selected to cause a logging application to generate a log of data corresponding to the inputs received or actions performed by the touch screen device 108 during the testing protocol. At $T_0$ the robot 102 may move the tip 138 into contact with the touch screen to initiate the generation of the data log.

During the time interval spanning from $T_1$ to $T_2$, the platform may perform a portion of a testing protocol while the touch screen device 108 generates a log thereof. For example, the testing protocol may include confirming that the touch screen device 108 is capable of receiving messages and/or phone calls. At some point during the testing protocol, it may be desirable to engage another target feature, e.g. "Pause Logging" target feature 106(2) but the location of this target feature may not be ascertainable until the target feature 106(2) is actually visible on the touch screen. Furthermore, in some implementations one or more inputs may be required in order to cause the target feature 106(2) to be displayed. Accordingly, at $T_2$ the robot 102 may move the tip 138 into contact with the touch screen to cause the cause the target feature 106(2) to be displayed, e.g. the tip 138 may be swiped across the touch screen to cause a command menu to be displayed, e.g. the command menu as displayed on UI 128 of FIG. 1 and in various displays portions of FIG. 2.

During the time interval spanning from $T_3$ to $T_4$, the platform may identify the location of the target feature 106(2) and use the location to supplement a high-level instruction, e.g. an instruction to pause the logging task. For example, the platform manager 116 may access visual characteristic data generated using the feature definition module 122 and provide this data to the feature locator module 124 for use in scanning imagery received from the camera 110. Upon determining a location of and/or coordinates for the target feature 106(2), the feature locator module may provide this information to the test protocol module 120 which then may convert the high-level instruction of pausing the logging task into detailed instructions which are understandable by the robot 102, e.g. G-code (or other numerical control programming language) instructing the robot 102 to move the tip 138 into contact with the touch screen at the current location of the target feature 106(2). Then, at $T_4$ the specific instruction robotic instructions may be transmitted by the controller 104 to the robot 102 thereby causing the robot 102 to selectively engage the target feature 106(2).

During the time interval spanning from $T_4$ to $T_5$, the platform may perform additional portions of the testing protocol until a time when it may be desirable to engage another target feature 106(3), e.g. a "Resume Logging" target feature. In some implementations, the platform may perform a similar action to that which was performed at $T_2$ to cause the cause the target feature 106(3) to be displayed. However, it may then be determined that although the command menu is being displayed the "Resume Logging" target feature 106(3) is not currently being displayed. Accordingly, at $T_5$ the platform may respond to this determination by causing the touch screen device 108 to change the imagery until the target feature is displayed, e.g. by swiping the tip 138 up from the bottom of the screen to scroll through the entire command menu until the "Resume Logging" target feature 106(3) is identified by the feature locator module 124. For example, during the time interval spanning from $T_5$ to $T_6$, the platform may locate and select the target feature 106(3).

Figure 3:
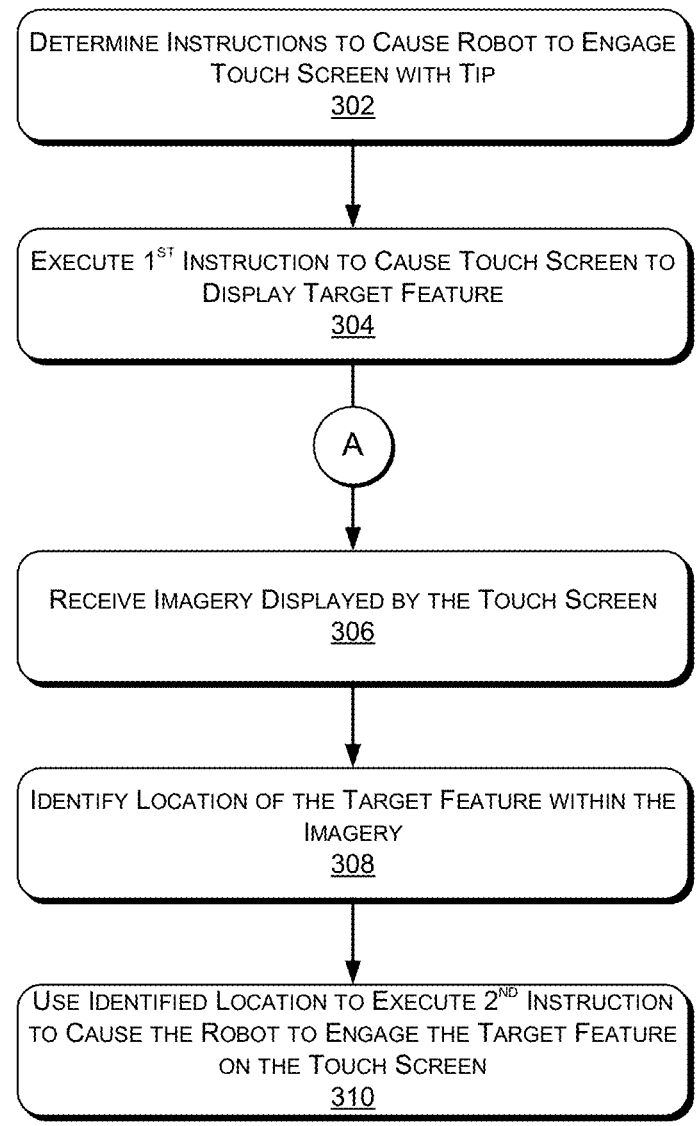
FIG. 3 is a flow diagram of an illustrative process to perform testing on the touch screen device that includes robotically engaging the target feature at a location thereof that is identified based on a camera feed.

FIG. 3 is a flow diagram 300 of an illustrative process to perform testing on the touch screen device that includes robotically engaging the target feature at a location thereof that is identified based on a camera feed. The process 300 is illustrated as a collection of blocks in a logical flow graph, which represent a sequence of operations that can be implemented in hardware, software, or a combination thereof. The collection of blocks is organized under respective entities that may perform the various operations described in the blocks. In the context of software, the blocks represent computer-executable instructions that, when executed by one or more processors, perform the recited operations. Generally, computer-executable instructions include routines, programs, objects, components, data structures, and the like that perform particular functions or implement particular abstract data types. The order in which the operations are described is not intended to be construed as a limitation, and any number of the described blocks can be combined in any order and/or in parallel to implement the process. Other processes described throughout this disclosure, in addition to the process 300, shall be interpreted accordingly.

At 302, the platform may determine instructions corresponding to a testing protocol to cause the robot 102 to engage the touch screen with the tip 138. The instructions may be designed to simulate user interactions with the touch screen device 108, e.g. the tip 138 may emulate conductive properties of a human fingertip and the instructions may cause the robot 102 to move the tip (or tips) as a user would move her fingers to control the touch screen device 108.

At 304, the platform may command the robot 102 to execute a first instruction which includes one or more numerical control (NC) commands to control movement of the tip 138 by the robot, e.g. G-code commands defining robotic actuations to achieve precise movement of the tip 138. In some implementations, the execution of the first instruction causes the touch screen device 108 to display imagery that includes at least a target feature 106. For example, if the target feature 106 corresponds to a notification and/or command menu then the first instruction may prompt the touch screen device 108 to open a menu of notifications and/or commands. Alternatively, if the target feature corresponds to an application icon which may appear on one of numerous virtual screens (e.g. a touch screen device operating system may organize application icons on multiple virtual screens which a user may toggle through to locate an icon of interest) then the first instruction may prompt the touch screen device 108 to toggle to a virtual screen on which the target feature is displayed.

At 306, the platform may receive, from the camera 110, recorded imagery which includes content displayed by the touch screen device 108. For example, the touch screen device 108 may be situated and/or secured within a field-of-view of the camera 110 which may transmit a live imagery feed (e.g. a video feed) to the platform and/or numerous still images. As used herein, the term "recording" (e.g. a recording of the imagery) is not limited to recordings which are stored for any particular duration of time on a storage medium but rather includes any transmission of imagery captured by the camera 110.

At 308, the platform may scan or otherwise analyze the imagery received from the camera 110 to identify the location of the target feature, e.g. coordinates within a reference system used to control the robot. In some instances, the location may be represented as estimated center point of the target feature, e.g. a centroid of the feature. In some instances, the location may be represented as a geometrical perimeter of the target feature, e.g. a square or circle defining boundaries of the target feature. Identifying the location of the target feature at 308 may be based on a pattern recognition algorithm to enable the feature locator module 124 to access a data file storing pattern information, e.g. visual characteristic information corresponding to a pattern, and use this data file to scan the imagery and match the pattern information to one or more portions of the imagery. For example, the feature locator module 124 may access a data file corresponding to the "Pause Logging" target feature 106(2) and use this file to identify any portions of the imagery which resemble or otherwise match the visual characteristics of the "Pause Logging" symbol as displayed in FIG. 2. In some implementations, the identifying the location of the target feature at 308 may utilize machine learning techniques to match patterns corresponding to the data file with portions of the imagery by recognition of patterns and regularities there between.

Identifying the location of the target feature at block 308, may include identifying one or more pixels of the camera imagery that correspond to the location of the target image. For example, the feature locator module 124 may determine that the centroid of the target feature is displayed substantially by a particular pixel at a known location in the imagery. The platform may be calibrated such that the relationship between pixel locations to corresponding reference coordinate locations is known and, therefore, that reference coordinate system locations, e.g. a coordinate system used to program NC commands, may be determined directly from pixel location data.

At 310, the platform may use the identified location to cause the robot to engage the target feature on the touch screen, e.g. move the tip into contact with the touch screen at the identified location. Specific NC commands may be generated and transmitted to the robot 102 to define specific tip actuation movements. For example, the robot 102 may be calibrated to define an x-y coordinate system parallel to the touch screen with an additional z-coordinate being perpendicular to the touch screen. Accordingly, based on such a coordinate system NC commands (e.g. G-code commands) may be generated to define specific actuations to be performed by the robot 102.

Figure 4:
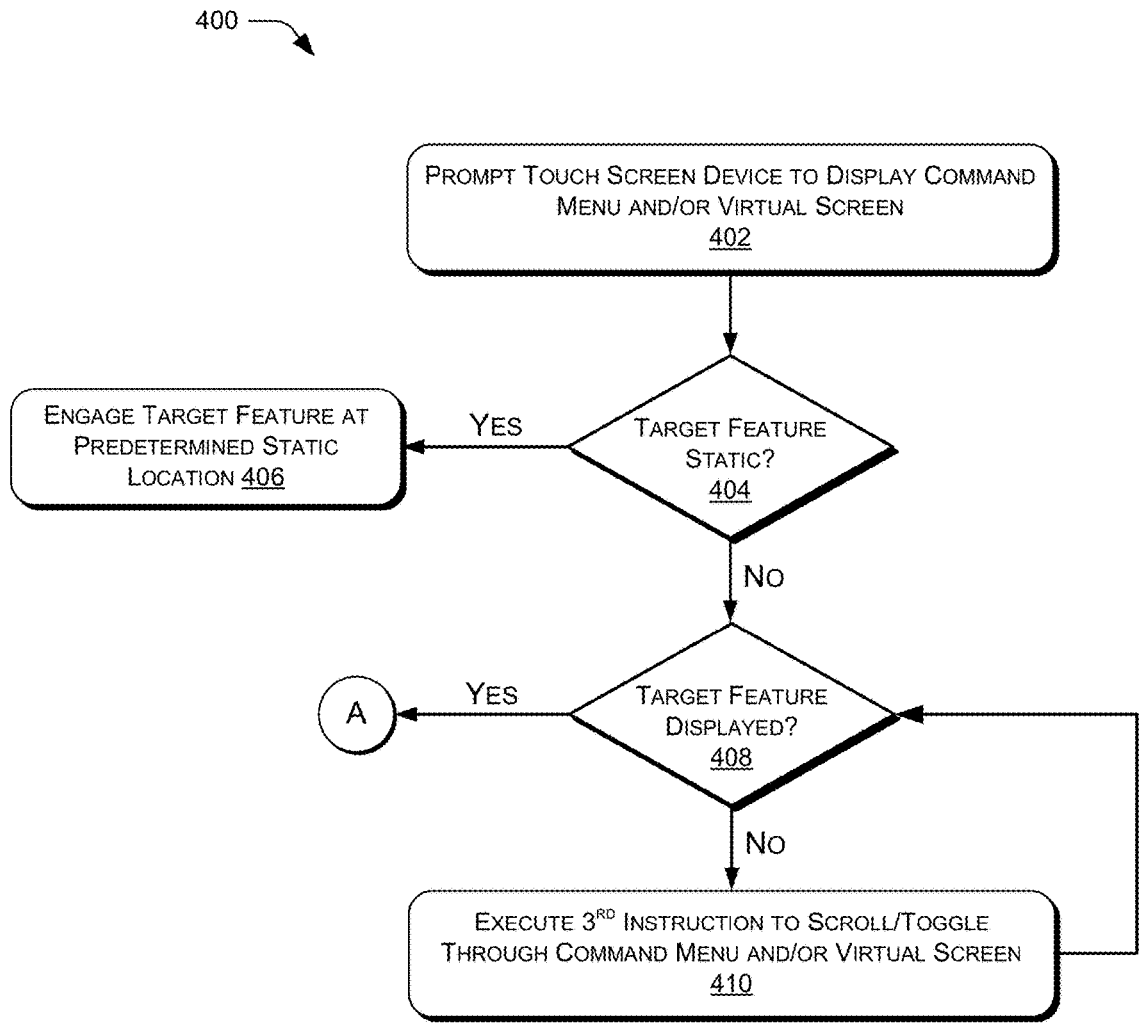
FIG. 4 is a flow diagram of an illustrative process to perform testing on the touch screen device that includes determining whether the target feature has a known/static location or an unknown/dynamic location.

FIG. 4 is a flow diagram of an illustrative process to perform testing on the touch screen device 106 that includes determining whether the target feature has a known/static location or an unknown/dynamic location.

At 402, the platform may prompt the touch screen device to display a command menu and/or a virtual screen. For example, the platform may cause the robot 102 to swipe up or down from the top of the touch screen to open a notification/command menu, e.g. as displayed in FIG. 2. Alternatively, the platform may cause the robot 102 to swipe left or right on the touch screen to scroll through various virtual screens which display different groupings of features and/or application icons.

At 404, the platform may determine whether the target feature is static such that it is displayed at a constant location on the touch screen device. For example, the "WiFi ON-Off" target feature 106(4) as shown in FIG. 2 may be static such that anytime the command menu is being displayed the "WiFi ON-Off" button is always displayed on the same location on the touch screen. If the target feature is static (e.g. having an input location that is determinable prior to providing the instruction to open the command menu) then the process may proceed to 406 at which the target feature may be engaged at the predetermined location. For example, in a scenario where the testing protocol includes turning the Wifi functionality of the touch screen device 108 on or off, then the platform may proceed from block 402 to block 406 without analyzing any imagery to determine a location of the "WiFi ON-Off" target feature 106(4) because the location is known before it is even displayed.

However, if the target feature is dynamic (e.g. having an input location that is undeterminable until it is actually displayed on the touch screen) then the process may proceed to block 408 at which it is determined whether the target feature is currently displayed. For example, the platform may scan received imagery to locate the target feature. Upon a determination that the target feature is currently displayed, the process may proceed to block 306 as described above. Upon a determination that the target feature is not currently displayed, the process may proceed to block 410 at which an instruction is executed which causes the touch screen device to change the imagery displayed by scrolling through a command menu and/or toggling through various virtual screens until the target feature is displayed and locatable. For example, while performing a testing protocol the touch screen device 106 may be instructed (via a command from the robot 102) to download an application. The touch screen device 108 may be configured to display application icons in a grid configured to display up to a predetermined number of application icons, e.g. in a 4 by 4 grid configuration a particular virtual screen may display up to 16 application icons. If the touch screen device 108 currently has a single virtual screen with 15 or less application icons, an application icon for the newly downloaded application may be placed on the existing virtual screen and the controller 104 may locate it via imagery received from the camera 110. Alternatively, if the existing virtual screen already includes a full grid of 16 application icons, then the application icon for the newly downloaded application may be placed on a newly created virtual screen. In such a case the controller may initially search for the icon on one virtual screen and, if it is not located on that screen, the controller 104 may cause the robot 102 to scroll to the other new virtual screen.

FIGS. 5A-5C depict the platform in various states of a camera calibration procedure for configuring the camera 110 with an offset focal point or plane with respect to the touch screen. For example, in various implementations the camera 110 may be intentionally out of focus with respect to the touch screen device. In particular, the actual focal point of the camera 110 may be intentionally set either in front of or behind the touch screen that is displaying the imagery.

Referring to FIG. 5A, a focal jig 502 which includes a focal target 504 may be placed at a testing location 506. In some embodiments, the testing location 506 may include one or more positioning elements 508 such as, for example, tapered pegs as shown in FIG. 5. The positioning elements may be configured to mate one or both of the focal jig 502 and/or a device fixture 510 for securing the touch screen device 108 at the testing location. For example, the focal jig 502 depicted in FIG. 5A is shown to interlock/mate with the same positioning elements 508 with which the device fixture 510 interlocks with in FIG. 5C. As illustrated, the distance of the focal target 504 from the camera 110 (see FIG. 5A) is less than the distance from the touch screen of the touch screen device 108 from the camera (see FIG. 5C). Accordingly, upon causing a focal point of the camera 110 to lie on the focal target 504, e.g. making the image rendered by the camera 110 of the focal target 504 as crisp as possible, and then switching out the focal jig 502 with the device fixture 510, the camera 110 will be intentionally out of focus with the touch screen device 108 by a focal offset distance 512.

Referring to FIG. 5B, in some implementations, the focal offset distance 512 may be achieved without the use of the focal jig 502 but rather by placing a focal target 514 above the touch screen device 108, e.g. placing a block with a focal target affixed thereto directly on top of the touch screen device 108. The focal offset distance 512 achieved by the implementation shown in FIG. 5B is demonstrated by the light grey lines extending from FIG. 5B with the focal target 514 on the screen to FIG. 5C in which the focal target 514 has been removed.

FIG. 6 is a flow diagram of an illustrative process 600 to calibrate a camera to have a focal offset from the touch screen device during or prior to a testing protocol. Process 600 describes steps to be taken to utilize the structures depicted in FIGS. 5A-5C. Other structures may also be utilized to achieve the focal offset distance 512.

At 602, a touch screen device may be placed at a testing location with the field of view of the camera. For example, as depicted in FIG. 5C, the touch screen device 108 may be secured to the device fixture 510 which may be positively located at the testing location via the positioning elements 508.

At 604, the camera may be focused or calibrated to achieve the focal offset distance 512 from the touch screen device 108. The focal offset distance 512 may reduce and/or eliminate distortions of the imagery recorded by the camera during the testing protocol and, therefore, may improve the ability of the feature locator module 124 to identify and locate coordinates for target features. For example, distortions in the imagery such as Moire lines may impede pattern recognition. The negative effects that imagery distortions such as Moire lines may have on pattern recognition techniques may outweigh the negative effects of the camera being slightly out of focus, i.e. by the focal offset distance 512. In some implementations, causing the focal offset distance at 604 take place prior to placing the touch screen device at the testing location at block 602 and may include focusing the camera 110 on the focal target 504 of the focal jig 502 at block 606 of process 600. In some implementations, causing the focal offset distance at 604 take place subsequent to placing the touch screen device at the testing location at block 602 and may include placing the focal target 514 on top of the touch screen device 108 and then focusing the camera 110 on the focal target 514 at block 608 of process 600.

Once the focal offset distance 512 has been achieved, a computer-implemented testing protocol may be initiated at block 610. For example, an exemplary computer-implemented testing protocol may include those operations described with respect to FIGS. 3 and 4 of the present disclose.

Although the subject matter has been described in language specific to structural features and/or methodological acts, it is to be understood that the subject matter defined in the appended claims is not necessarily limited to the specific structural features and/or methodological acts described. Rather, the specific structural features and/or methodological acts are disclosed as exemplary forms of implementing the claims. The scope of the present disclosure and appended claims is not limited by these exemplary forms. In particular, numerous variations, whether explicitly provided for by the specification or implied by the specification, such as variations in structure features and/or methodological acts, whether now known in the art or subsequently developed, may be implemented by one of skill in the art in view of this disclosure.

What is claimed is:

1. A method comprising:
   determining a plurality of instructions to cause a robot to move a tip to selectively engage a touch screen of a touch screen device to provide the touch screen device with inputs corresponding to a testing protocol, wherein the touch screen is within a field-of-view of a camera, and wherein the inputs simulate user interactions with the touch screen device;

executing a first instruction, of the plurality of instructions, to cause the robot to provide the touch screen device with a first input, the first input causing the touch screen device to display imagery that includes a command menu that includes at least a target feature, a location of the target feature depending at least partially on a state of the command menu;

receiving, from the camera, a recording of the imagery that includes at least the target feature;

identifying, based on the recording of the imagery, the location of the target feature within the field-of-view of the camera;

based on the identifying the location of the target feature, executing a second instruction to cause the robot to move the tip to selectively engage the touch screen at the location of the target feature thereby providing the touch screen device with a second input that is associated with the target feature; and wherein the touch screen device is configured to perform a lodging task to generate a data log during the testing protocol, and wherein the second input causes the touch screen device to initiate, pause, resume, or terminate the logging task.

2. The method as recited in claim 1, further comprising:
determining, based on the recording of the imagery, an absence of the target feature from the field-of-view of the camera; and
in response to the determining the absence of the target feature, executing a third instruction to cause the robot to provide the touch screen device with a third input, the third input causing the touch screen device to scroll through the command menu thereby causing the imagery to include the target feature.

3. The method as recited in claim 1, further comprising:
prior to the executing the first instruction, causing a graphical user interface of a user terminal to display an image of the target feature; and
receiving, at the user terminal, a user input that defines one or more boundaries of the target feature within the image on the graphical user interface, wherein the identifying the location of the target feature within the field-of-view of the camera is based at least on the user input.

4. The method as recited in claim 1, further comprising receiving a data file corresponding to one or more visual characteristics of the target feature, wherein the identifying the location of the target feature within the field-of-view of the camera is based at least on the data file.

5. The method as recited in claim 1, wherein a first set of the plurality of instructions correspond to static input locations that are determinable prior to providing the touch screen device with individual instructions of the first set, and wherein a second set of the plurality of instructions correspond to dynamic input locations that are undeterminable prior to providing the touch screen device with individual instructions of the second set.

6. A system for engaging a target feature that is dynamically positioned during a testing protocol, the system comprising:
a robot to provide inputs to a touch screen of a touch screen device by moving a tip into contact with the touch screen, wherein the touch screen is within a field-of-view of a camera configured to record imagery rendered by the touch screen device; and
a controller to control movement of the tip by the robot by performing operations of:
providing the robot with a first instruction to cause the robot to provide the touch screen device with a first input;
receiving, from the camera, a recording of the imagery rendered by the touch screen device;
scanning the recording of the imagery to determine a reference coordinate location of the target feature within a reference coordinate system associated with the robot;
determining, based on the scanning, an absence of the target feature from the field-of-view of the camera;
in response to the determining the absence of the target feature, executing a second instruction to cause the robot to provide the touch screen device with a second input thereby causing the imagery to include the target feature; and
based on the reference coordinate location, providing the robot with a third instruction to cause the robot to provide the touch screen device with a third input, the third input to simulate a user selection of the target feature.

7. The system of claim 6, the operations further comprising:
receiving, via a user terminal, user input associated with boundaries corresponding to a plurality of target features within one or more images on a graphical user interface; and
generating, based on the user input associated with the boundaries, target feature data corresponding to visual characteristics of individual target features of the plurality of target features, wherein the scanning includes accessing a portion of the target feature data associated with the target feature.

8. The system of claim 6, wherein the third input causes the touch screen device to scroll from a first set of application icons to a second set of application icons, the second set of application icons including the target feature.

9. The system of claim 6, wherein the first input includes at least one of a tap movement to engage the tip to a single location on the touch screen or a slide movement to drag the tip across a portion of the touch screen.

10. The system of claim 9, wherein at least one of the tap movement or the slide movement causes the touch screen device to display the target feature.

11. The system of claim 6, the operations further comprising:
determining, based on the scanning, pixel location data corresponding to at least one pixel of the recording at which the target feature is located; and
determining the reference coordinate location based on the pixel location data.

12. The system of claim 6, wherein the scanning the recording of the imagery to determine the reference coordinate location includes matching visual characteristics of a predetermined pattern to a portion of the recording of the imagery.

13. The system of claim 6, wherein the operations further comprise performing a logging task to generate a data log during the testing protocol, and wherein the second input causes the touch screen device to initiate, pause, resume, or terminate the logging task.

14. A method comprising:
placing a touch screen device at a testing location that is within a field-of-view of a camera and adjacent to a robot configured to move a tip into contact with a touch screen of the touch screen device;
placing a focal target above the touch screen device;
focusing the camera onto the focal target to cause a focal point of the camera to be in front of or behind the touch screen; and
initiating a computer-implemented testing protocol to test one or more functionalities of the touch screen device, the computer-implemented testing protocol to perform operations including:
receiving, from the camera while the focal point is in front of or behind the touch screen, imagery displayed by the touch screen, the imagery including at least a target feature;
identifying, based on the imagery, a location of the target feature on the touch screen; and
causing the robot to select the target feature by moving the tip into contact with the touch screen at the location.

15. The method of claim 14, wherein the causing the focal point of the camera to be in front of or behind the touch screen includes:
placing a focal jig at the testing location, the focal jig including at least one focal target;
focusing the camera onto the at least one focal target; and
prior to the placing the touch screen device at the testing location, removing the focal jig from the testing location.

16. The method of claim 15, wherein the placing a touch screen device at the testing location includes securing the touch screen device to a device fixture, the touch screen being accessible when the touch screen device is in the device fixture.

17. The method of claim 16, wherein the testing location includes one or more positioning elements configured to commonly mate with each of the focal jig and the device fixture.

18. The method of claim 14, further comprising performing a logging task to generate a data log during the computer-implemented testing protocol.

19. The method of claim 14, wherein identifying the location of the target feature on the touch screen comprises determining pixel location data corresponding to at least one pixel at which the target feature is located.

* * * * *